(12) United States Patent
Liao et al.

(10) Patent No.: US 7,083,430 B2
(45) Date of Patent: Aug. 1, 2006

(54) LAND GRID ARRAY SOCKET WITH SCRAPE-RESISTANT HOUSING

(75) Inventors: Fang-Jwu Liao, Tu-Chen (TW); Ming-Lun Szu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 1 day.

(21) Appl. No.: 10/894,739

(22) Filed: Jul. 19, 2004

(65) Prior Publication Data
US 2005/0014400 A1    Jan. 20, 2005

(30) Foreign Application Priority Data
Jul. 18, 2003    (TW) .............................. 92213177 U

(51) Int. Cl.
*H01R 12/00* (2006.01)
(52) U.S. Cl. .......................................... 439/73
(58) Field of Classification Search .................. 439/73, 439/330–331, 70, 342
See application file for complete search history.

(56) References Cited

U.S. PATENT DOCUMENTS

| | | | |
|---|---|---|---|
| 6,574,109 B1 * | 6/2003 | McHugh et al. | 361/719 |
| 6,722,909 B1 * | 4/2004 | McHugh et al. | 439/331 |
| 2004/0142584 A1 * | 7/2004 | Ma | 439/73 |

* cited by examiner

*Primary Examiner*—J. F. Duverne
(74) *Attorney, Agent, or Firm*—Wei Te Chung

(57) ABSTRACT

A land grid array socket includes an insulative housing (2), a stiffener (4) partly covering and reinforcing the housing, a metal clip (5) pivotably engaged on one end of the stiffener, and a lever (6) mounted on two opposite ends of the stiffener for fastening the clip onto the housing. The housing includes a floor (20), a number of sidewalls (24, 26) extending upwardly from the floor and a receiving space defined between the bottom wall and the sidewalls. A pair of step (263) is formed on the floor, for sustaining the LGA package (3) thereon. The sidewall that is far from the clip defines a plurality of rigid blocks (2683) in an inner side for resisting scrape between the sidewall and the LGA package. Therefore, the sidewall of the housing can be protected from scraping damage during insertion of the LGA package into the housing.

10 Claims, 5 Drawing Sheets

LAND GRID ARRAY SOCKET WITH SCRAPE-RESISTANT HOUSING

BACKGROUND OF THE INVENTION

1. Field of the Invention

The present invention relates to a land grid array socket for electrically connecting an electronic package such as an integrated circuit (IC) chip with a circuit substrate such as a printed circuit board (PCB), and particularly to a socket adapted for receiving a land grid array (LGA) package therein and electrically connecting the LGA package with a PCB.

2. Description of the Prior Art

An IC package having contact pads arranged on a floor thereof in a land grid array is known as an LGA package.

Connectors for removably mounting an LGA package on a PCB are known as LGA sockets. An LGA socket typically comprises an insulative housing, a plurality of electrical contacts received in the housing, a metal clip pivotably mounted to an end of the housing, and a lever pivotably mounted to an opposite end of the housing for engaging with the clip.

Referring to FIGS. 5 to 7, a conventional LGA socket is illustrated. The LGA socket comprises an insulative housing 2' receiving a plurality of contacts (not shown) therein, a stiffener 4' attached to the housing 2', a clip 5' pivotably mounted to an end of the stiffener 4', and a lever 6' pivotably mounted to an opposite end of the stiffener 4' for engaging with the clip 5'. The housing 2' comprises a floor 20', two opposite first sidewalls 26' and two opposite second sidewalls 24' adjacent to the first sidewalls 26'. A plurality of passageways 22' is defined in the floor 20', for receiving corresponding numbers of contacts therein. The contacts each protrude outwardly from a top portion of the housing 2', for connecting with the contact pads (not shown) of the LGA package 3'. Bosses 265', 266' are respectively formed on the first sidewalls 26', for positioning and keying the LGA package 3' in the housing 2'. Notches 32', 34' are defined in the LGA package 3', for interferingly engaging with the bosses 265', 266' of the housing 2'. The LGA package 3' is, thereby, retained in the housing 2'. A step 263' is formed at each side of the floor 20' and in communication with the first sidewalls 26', for supporting two opposite side of the LGA package 3' thereon.

In use, the LGA package 3' is disposed on the housing 2'. The clip 5' is rotated down onto the LGA package 3', with pressing portion (not labeled) of the clip 5' resting on the LGA package 3'. Then, the lever 6' is rotated down, for fastening the clip 5'. In this position, the clip 5' is pressed by the lever 6', and the pressing portion of the clip 5' presses on the LGA package 3' tightly.

The clip 5' defines a pair of securing portion 51' at one end of the clip 5', and the corresponding side of the stiffener defines a pair of slots 41' for engaging with the securing portion 51'. During the rotation of the clip 5', the clip 5' first presses one side of the LGA package 3 that is near to the securing portion 51' of the clip 5', and the opposite side that is far from the securing portion 51' is not pressed. Therefore, the unpressed side of the LGA package will move upwardly and even depart from the predetermined horizontal place. When the clip 5' is substantially oriented at a horizontal position parallel to the top surface of the housing, the raised side will be finally pressed down onto the step 263'. Because the horizontal displacement of the LGA package 3', the LGA package 3' is prone to scrape corresponding sidewall 26' of the housing 2' during being pressed to predetermined position. The scrape will affect the electrical characters of the LGA socket and even damage the housing 2'.

Furthermore, when the LGA package is slantways positioned in the housing, with one side of the LGA package 3' resting on the step 263' and the opposite side abutting against corresponding first sidewall 26'. When the lever 6' is rotated down to press on the clip 5', the pressing portion of the clip 5' pushing down on the LGA package 3'. Then the LGA package 3' moves downwardly under the pressing force of the clip 5' applied by the lever 6', sides of the LGA package 3' near the first sidewalls 26 abutting against and urging inner surface of the corresponding first sidewalls 26. Accordingly, scraping of inner surface of the first sidewalls 26' happens. As a result, the housing 2' is prone to be damaged, and reliability of the electrical connection between the LGA package 3' and the contacts of the housing 2' is accordingly decreased.

In view of the above, a new land grid array socket which overcomes the above-mentioned disadvantages is desired.

SUMMARY OF THE INVENTION

Accordingly, an object of the present invention is to provide a land grid array socket for electrically connecting an electronic package such as an LGA central processing unit (CPU) with a circuit substrate such as a printed circuit board (PCB), wherein the LGA socket has a housing that resists scrape from the LGA package affectively.

Another object of the present invention is to provide an LGA socket for electrically connecting an LGA package to a printed circuit board (PCB), wherein contacts pads of the LGA package can be reliably connected with respective contacts of the LGA socket.

To achieve the above-mentioned objects, a land grid array socket in accordance with the present invention comprises an insulative housing mounted on a printed circuit board, a stiffener partly covering and reinforcing the housing, a metal clip pivotably engaged on one end of the stiffener, and a lever mounted on two opposite ends of the stiffener for fastening the clip onto the housing. The housing comprises a floor, a plurality of sidewalls extending upwardly from the floor and a receiving space defined between the bottom wall and the sidewalls, for accommodating an LGA package therein. A pair of steps is formed on the floor, for sustaining the LGA package thereon. The sidewall that is far from the clip defines a plurality of rigid blocks in an inner side for resisting scrape between the sidewall and the LGA package. Therefore, the sidewalls of the housing can be protected from scraping damage during insertion the LGA package into the housing.

Other objects, advantages and novel features of the invention will become more apparent from the following detailed description when taken in conjunction with the accompanying drawings, in which:

DETAILED DESCRIPTION OF THE PREFERRED EMBODIMENTS OF THE INVENTION

Reference will now be made to the drawings to describe the present invention in detail.

Figure 1:
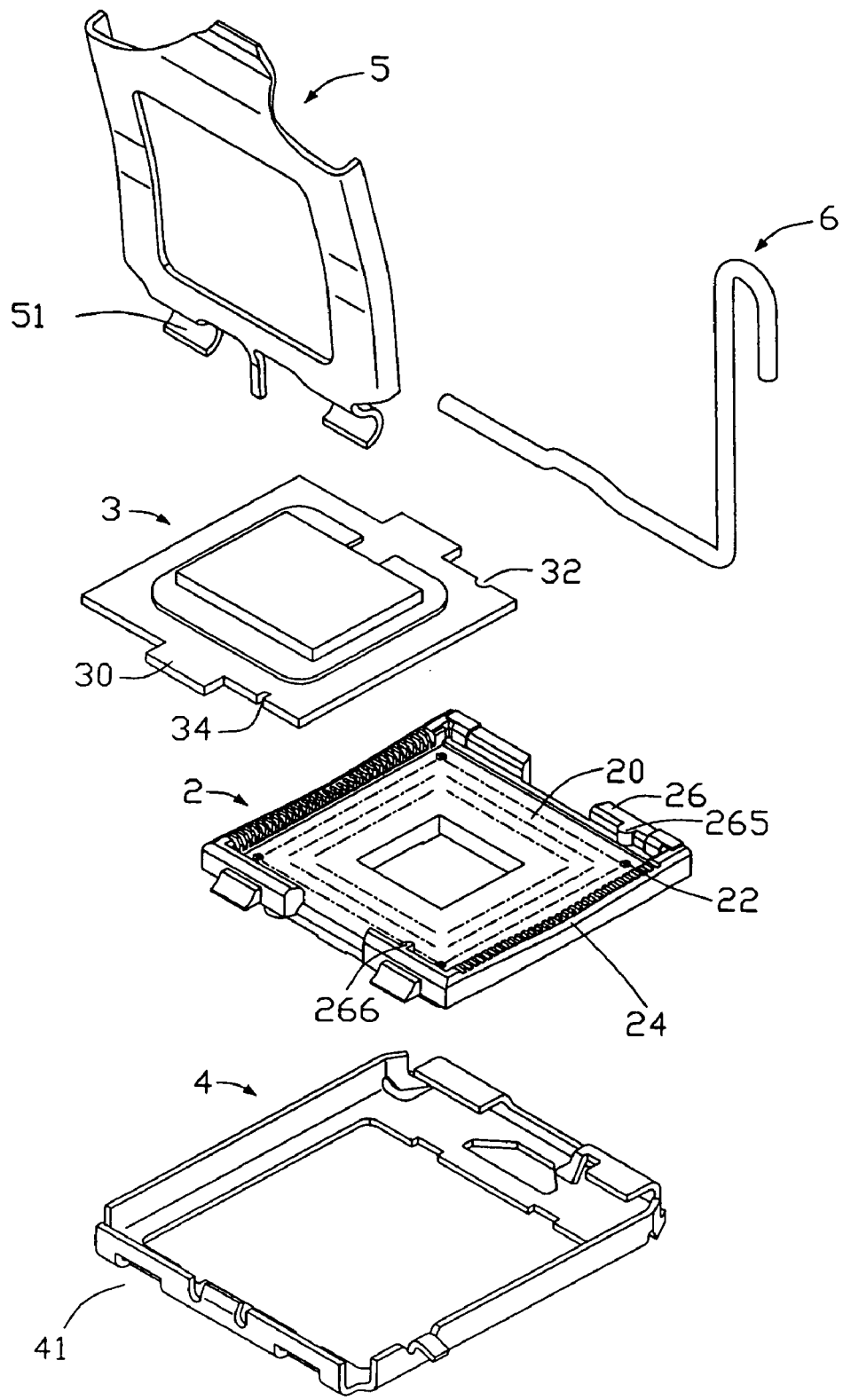
FIG. 1 is an exploded, isometric view of a land grid array socket in accordance with the present invention, with a land grid array package ready to be mounted in the socket.
Figure 2:
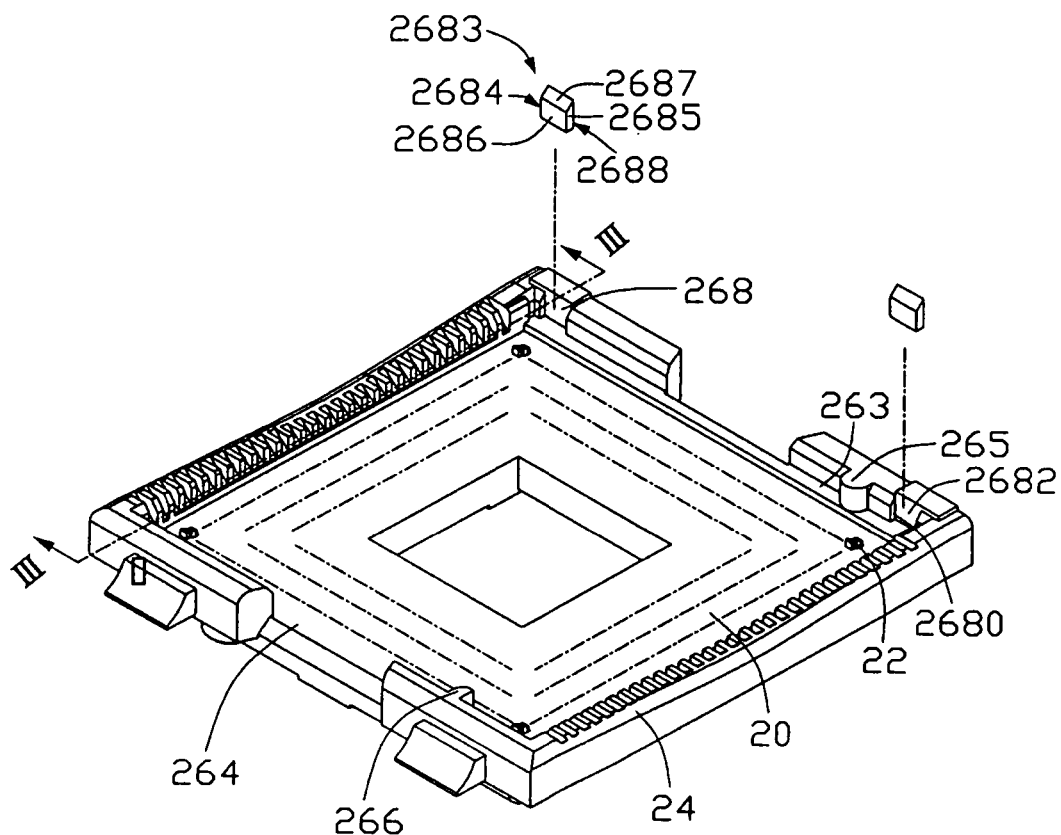
FIG. 2 is an isometric view of a housing of the land grid array socket of FIG. 1, with the rigid block out of the housing.
Figure 3:
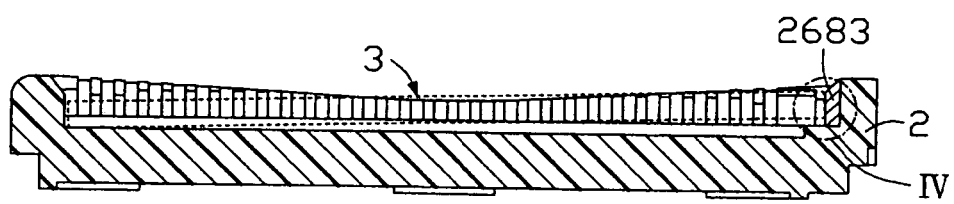
FIG. 3 is a cross-sectional view taken along line III—III of FIG. 2, showing the LGA package engaging with the rigid block of the housing.
Figure 4:
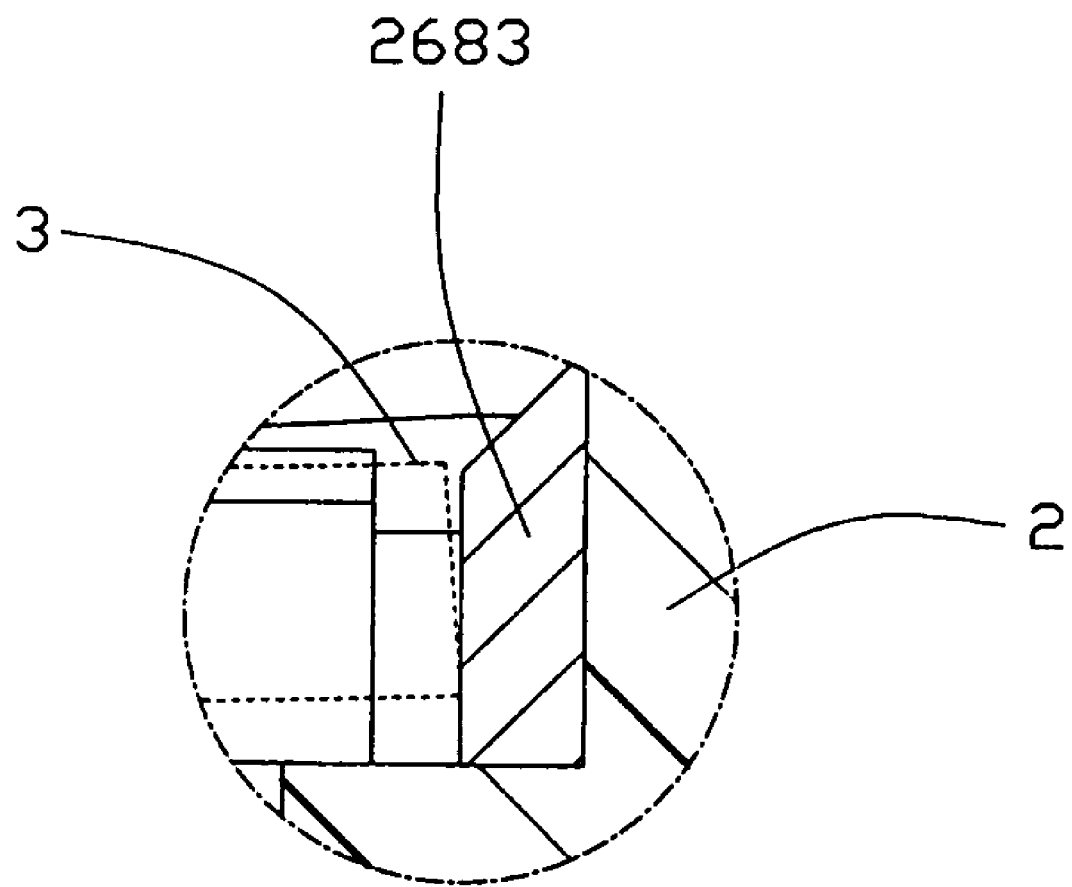
FIG. 4 is an enlarged view of a circuit portion IV—IV of FIG. 3.
Figure 5:
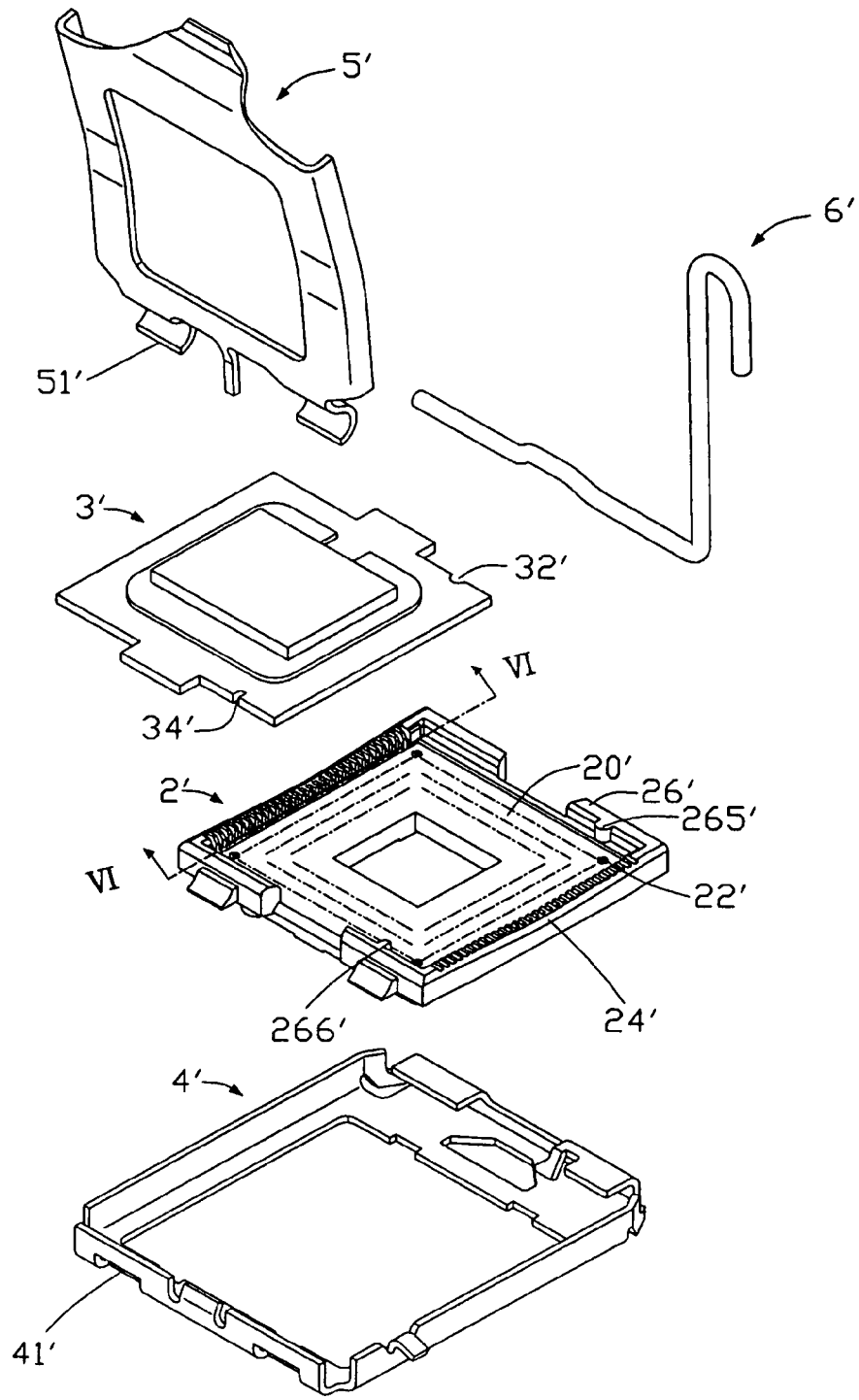
FIG. 5 is an exploded, isometric view of a conventional land grid array socket, with a land grid array package ready to be mounted in the socket.
Figure 6:
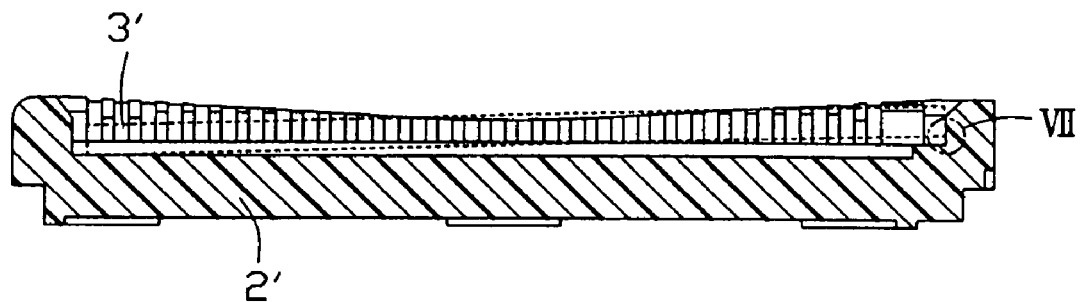
FIG. 6 is a cross-sectional view taken along line VI—VI of FIG. 5, showing the LGA package engaging with first sidewall of the housing.
Figure 7:
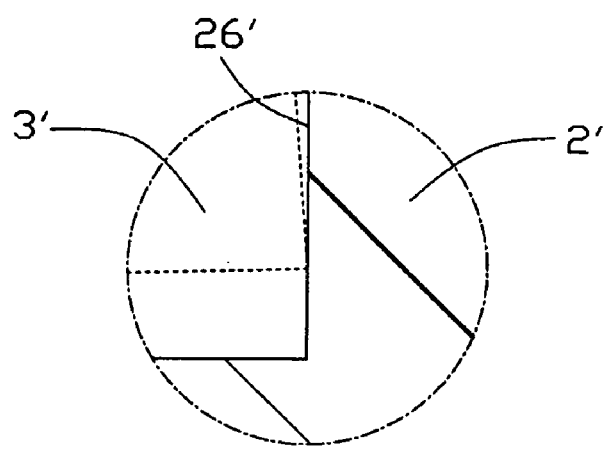
FIG. 7 is an enlarged view of a circuit portion VII—VII of FIG. 6.

Referring to FIGS. 1–4, a land grid array (LGA) socket in accordance with a preferred embodiment of the present invention comprises an insulative housing 2 mounted on a printed circuit board (not shown), a stiffener 4 partly covering and reinforcing the housing 2, a metal clip 5 and a lever 6 pivotably engaged onto two opposite ends of the stiffener 4 respectively. An LGA package 3 is disposed between the housing 2 and the clip 5, for connecting with the printed circuit board via the socket 1.

The housing 2 is substantially rectangular. A floor 20 is defined in a middle of the housing 2. Two first sidewalls 26 and two second sidewalls 24 are defined around a periphery of the floor 20. The sidewalls 24, 26 and the floor 20 cooperatively define a substantially rectangular receiving space therebetween for receiving the LGA package 3. A plurality of passageways 22 is defined in the floor 21, for receiving corresponding number of electrical contacts (not shown) therein. A step 263 is formed at each side of the floor 20 and in communication with the first and second sidewalls 24, 26. The step 263 has a mounting surface (not labeled) for sustaining two opposite ends of the LGA package 3 thereon. The steps 263 can avoid the LGA package 3 totally presses on the contacts, and thereby protecting the contacts from damage by the LGA package 3 with excessive pressure. A cutout 264 is defined in a middle portion of each first sidewall 26, respectively. The cutout 264 communicates with the receiving space, for engageablely receiving the LGA package 3. The cutout 264 can also facilitate placement of the LGA package 3 into the housing 2 and extraction of the LGA package 3 thererfrom. First and second bosses 265, 266 are formed inwardly on inner sides of the first sidewalls 24 near one end thereof, respectively. The first and second bosses 265, 266 depend at bottom thereof on the step 263, for fixing the LGA package 3 in the receiving space of the housing 2.

The stiffener 4 comprises a first end having a pair of slots 41 for engaging with the clip 5, and a second end for mounting the lever 6. The housing 2 is fitly mounted in the stiffener 4, and one of the first sidewalls 26 is near to the first end of the stiffener 4, and the other opposite first sidewall 26 is near to the second end that mounting the lever 6. An inner side of the first sidewall 26 defines a vertical recess 268. The recess 268 comprises a bottom surface 2682, and a pair parallel side surfaces 2680. The side surfaces 2680 are slant to the bottom surface 2682. A rigid block 2683 is prepared for being inserted into the recess 268.

The rigid block 2683 has a configuration corresponding to the recess 268. The rigid block 2683 comprises a first side 2684 and a second side 2685, for engaging with the side surfaces 2680 of the rigid block 2683. The rigid block 2683 further comprises a slant top surface 2687, an inner surface 2688 for attaching onto the bottom surface 2682 of the recess 268 and abutting surface 2686 extending beyond the inner surface of the second side 26 into the receiving space. The top surface 2687 slants towards the receiving space for facilitating insertion of the LGA package into the housing 2. The abutting surface 2687 of the rigid blocking 2683 abuts against a lateral side of the LGA package during the LGA package being inserted into the housing 2.

The clip 5 is generally a rectangular frame. Opposite lateral sides of the clip 5 are bent slightly downwardly to form a pair of clasping portions (not labeled). A pair of curved securing portions 51 is formed at an end of the clip 5, for engaging in the slot 41 of the first end of the stiffener 4.

In use, once the LGA package is positioned on the housing 2, the clip 5 is rotated down onto the LGA package, with pressing portion (not labeled) of the clip 5 resting on the LGA package 3. Then, the lever 6 is rotated down, for fastening the clip 5. In this position, the clip 5 is pressed by the lever 6, and the pressing portion of the clip 5 presses on the LGA package 3 tightly.

During the rotation of the clip 5, the clip will first press one side of the LGA package 3 that is near to the securing portion 51 of the clip 5, and the opposite side that is far from the securing portion 51 is not pressed. Therefore, the unpressed end of the LGA package will move upwardly and even depart from the predetermined horizontal place. When the clip 5 is oriented at a horizontal position parallel to the top surface of the housing, the raised end will be finally pressed down onto the step 263. During the process of pressing down, the slant up surface 2687 guides the LGA package 3 into the housing 2 and the lateral side of the LGA package 3 engages with the rigid block 2683. Therefore, the housing 2 can effectively resisted scrape from the LGA package 3 by the rigid block 2683, and risk of damaging the housing is reduced.

In another embodiment, the rigid block 2683 protrudes directly from the inner side of the first sidewall, and the block 2683 can also protect the housing 2 from being damaged.

While preferred embodiments in accordance with the present invention have been shown and described, equivalent modifications and changes known to persons skilled in the art according to the spirit of the present invention are considered within the scope of the present invention as defined in the appended claims.

What is claimed is:

1. A land grid array socket comprising:
   a housing comprising a floor and a plurality of sidewalls extending around a periphery of the floor, the floor and the sidewalls cooperatively defining a receiving space for receiving an electronic package;
   a clip attached on the housing to press the electronic package;
   a lever for pressing the clip;
   a stiffener partly covering and reinforcing the housing, the stiffener comprising a first end for pivotably engaging with the clip and an opposite second end for engaging with the lever;
   wherein at least one rigid block is formed in the sidewall that is nearer the second end of the stiffener than the first end of the stiffener, the rigid block extends inwardly into the receiving space, to protect the sidewalls of the housing from being scrapingly damaged during inserting the package into the housing wherein the rigid block extends beyond an inner side of the sidewall towards the receiving space.

2. The land gird array socket as claimed in claim 1, wherein the sidewall that is near the second end of the stiffener defines a recess in an inner side thereof, and the rigid block is engagingly mounted in the recess.

3. The land gird array socket as claimed in claim 2, wherein the recess is longitudinal and comprises a bottom surface and a pair of parallel side surfaces, and the rigid block comprises a first side and a second side for engaging with the side surfaces of the rigid block.

4. The land gird array socket as claimed in claim 3, wherein the rigid block further comprises a slant top surface for facilitating insertion of the electronic package into the receiving space.

5. The land gird array socket as claimed in claim 1, wherein the rigid block protrudes directly from an inner side of the sidewall thereof towards the receiving space.

6. An electrical socket comprising:
a housing comprising a floor, a plurality of sidewalls extending around a periphery of the floor, the floor and the sidewalls cooperatively defining a receiving space for receiving an electronic package;
wherein at least one of the sidewalls defines rigid block, said rigid block protrudes inwardly into the receiving space, to protect the sidewalls of the housing from being scrapingly damaged during inserting the package into the housing; wherein the rigid block extends beyond an inner side of the sidewall thereof towards the receiving space; wherein the sidewall that is near to the second end of the stiffener defines a recess in an inner side thereof and the rigid block is engagingly mounted in the recess; wherein the recess is longitudinal and comprises a bottom surface and a pair of parallel side surfaces, and the rigid block comprises a first side and a second side to engage with the side surfaces of the rigid block second side for engaging with the side surfaces of the rigid block.

7. The electrical socket as claimed in claim 6, wherein the rigid block further comprises a slant top surface for facilitating insertion of the electronic package into the receiving space.

8. The electrical socket as claimed in claim 6, wherein the rigid block protrudes directly from an inner side of the sidewall thereof towards the receiving space.

9. The electrical socket as claimed in claim 6, wherein the housing comprises steps in two opposite sides of the floor and in communication with corresponding sidewalls.

10. An electrical socket comprising:
a housing comprising a floor, a plurality of sidewalls extending around a periphery of the floor, the floor and the sidewalls cooperatively defining a receiving space to receive a downwardly loading electronic package;
wherein at least one of the sidewalls defines a rigid block at a position, and said rigid block pretrudes and engages an edge of said electronic package rather than other portions of said one of the sidewalls when said electronic package is loaded in a tilted incorrect manner so as to correct such incorrect loading.

* * * * *